(12) United States Patent
Nair et al.

(10) Patent No.: US 7,126,166 B2
(45) Date of Patent: Oct. 24, 2006

(54) HIGH VOLTAGE LATERAL FET STRUCTURE WITH IMPROVED ON RESISTANCE PERFORMANCE

(75) Inventors: Rajesh S. Nair, Chandler, AZ (US); Shanghui Larry Tu, Phoenix, AZ (US); Zia Hossain, Tempe, AZ (US); Mohammed Tanvir Quddus, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 74 days.

(21) Appl. No.: 10/797,537

(22) Filed: Mar. 11, 2004

(65) Prior Publication Data

US 2005/0218431 A1    Oct. 6, 2005

(51) Int. Cl.
  *H01L 29/32*   (2006.01)
  *H01L 29/36*   (2006.01)
  *H01L 29/417*  (2006.01)

(52) U.S. Cl. .................. 257/110; 257/107; 257/120
(58) Field of Classification Search ............... 257/120, 257/107, 110, 134
See application file for complete search history.

(56) References Cited

U.S. PATENT DOCUMENTS

| 5,294,824 | A    |   | 3/1994  | Okada          |         |
|-----------|------|---|---------|----------------|---------|
| 6,097,063 | A    |   | 8/2000  | Fujihira       |         |
| 6,448,625 | B1   |   | 9/2002  | Hossain et al. |         |
| 6,507,071 | B1   | * | 1/2003  | Tihanyi        | 257/343 |
| 6,509,220 | B1   | * | 1/2003  | Disney         | 438/197 |
| 6,566,709 | B1   |   | 5/2003  | Fujihira       |         |
| 6,589,845 | B1   |   | 7/2003  | Nair et al.    |         |
| 6,639,277 | B1   |   | 10/2003 | Rumennik et al.|         |

* cited by examiner

*Primary Examiner*—Zandra V. Smith
*Assistant Examiner*—Kiesha Rose
(74) *Attorney, Agent, or Firm*—Kevin B. Jackson

(57) ABSTRACT

In one embodiment, a lateral FET cell is formed in a body of semiconductor material. The body of semiconductor material includes alternating layers of opposite conductivity type that extend between a trench drain region and a trench gate structure. The trench gate structure controls at least one sub-surface channel region. The body of semiconductor material provides sub-surface drift regions to reduce on resistance without increasing device area.

19 Claims, 3 Drawing Sheets

HIGH VOLTAGE LATERAL FET STRUCTURE WITH IMPROVED ON RESISTANCE PERFORMANCE

BACKGROUND OF THE INVENTION

This invention relates generally to semiconductor devices, and more specifically to lateral field effect transistor (FET) structures and methods of manufacture.

Metal-oxide semiconductor field effect transistors (MOSFETs) are a common type of integrated circuit device. A MOSFET device includes a source region, a drain region, a channel region extending between the source and drain regions, and a gate provided over the channel region. The gate includes a conductive gate structure disposed over and separated from the channel regions with a thin dielectric layer.

Lateral MOSFET devices are often used in high voltage (i.e., greater than 200 volts) applications such as off-line switching regulators in AC/DC voltage conversion. Lateral MOSFET devices typically comprise a source region and a drain region separated by an intermediate or drift region. A gate structure is disposed over the channel region of the device. In the on state, a voltage is applied to the gate to form a conduction channel region between the source and drain regions, which allows current to flow through the device. In the off state, voltage applied to the gate is sufficiently low so that a conduction channel does not form, and thus current flow does not occur. During the off state, the device must support a high voltage between source and drain regions.

ON resistance ($R_{ON}$) is an important performance figure of merit for MOSFET switching devices. ON resistance is the ohmic resistance that exists between an input and an output pin of a MOSFET switch when the switch is closed and passing a signal. ON resistance correlates to how much signal attenuation will result as the signal passes through the device. Another important figure of merit is specific on resistance ($R_{SP}$), which is the product of $R_{ON}$ and surface area, or $R_{ON}$*Area. A lower $R_{ON}$*Area allows a designer to use a smaller high voltage lateral MOSFET to meet ON resistance requirements for a given application, which reduces the area and cost of a power integrated circuit.

One problem with conventional high voltage lateral MOSFETs is that techniques and structures that tend to maximize breakdown voltage ($V_{BD}$) adversely affect $R_{ON}$ and vice versa. For example, typical lateral MOSFETs require a larger surface area in order to support a higher $V_{BD}$, which increases specific on-resistance ($R_{SP}$).

To overcome this problem, several designs have been proposed in an attempt to provide acceptable combinations of high breakdown voltage and low $R_{ON}$*Area. For example, devices have been designed with one or more reduced surface field (RESURF) regions and/or regions of localized doping (also referred to as superjunction or multiple conduction structures). However, these designs require expensive wafer processing involving multiple masking and ion implant steps, very deep diffused body regions or contacts (e.g., 30 to 40 microns deep), and/or expensive silicon on insulator substrates, which increase the cost of chip manufacturing. Also, these designs are not optimized to support a multitude of blocking voltages, which adds to cost.

Accordingly, a need exists for cost effective structures and methods that improve the Ron*Area performance of lateral MOSFET devices while maintaining high blocking voltage capability and manufacturing flexibility.

DETAILED DESCRIPTION OF A PREFERRED EMBODIMENT

Figure 1:
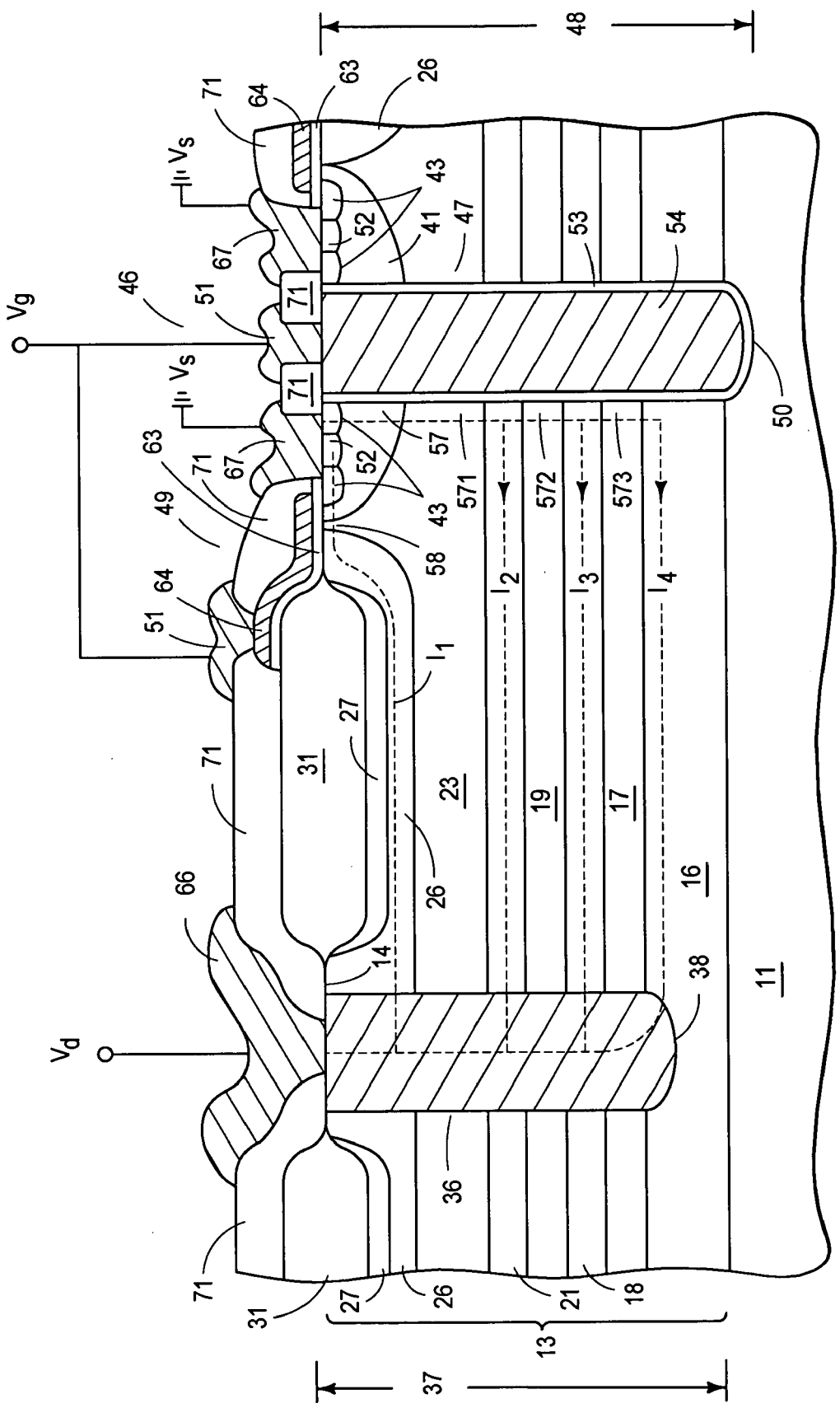
FIG. 1 illustrates an enlarged partial cross-sectional view of a MOSFET cell.

For ease of understanding, elements in the drawing figures are not necessarily drawn to scale, and like element numbers are used where appropriate throughout the various figures. While the discussion below concerns n-channel devices, the discussion also pertains to p-channel devices, which may be formed by reversing the conductivity type of the described layers and regions. Additionally, although several epitaxial layers are shown in the embodiments, more or less epitaxial layers may be used depending on performance requirements. The embodiment shown is suitable for a blocking voltage on the order of 700 volts.

FIG. 1 shows a partial cross-sectional view of an insulated gate field effect transistor (IGFET), lateral MOSFET, semiconductor or switching device, structure, or cell 10 having improved $R_{ON}$*Area performance and a high blocking voltage capability. By way of example, MOSFET cell 10 is among many such cells integrated into a semiconductor chip as part of a power integrated circuit. Alternatively, MOSFET cell 10 is a single discrete transistor.

Device 10 includes a first region of semiconductor material 11, which comprises for example, a p-type substrate having a dopant concentration of about $1.5 \times 10^{14}$ atoms/cm$^3$. A second region of semiconductor material 13 comprising a plurality of alternating layers of p-type and n-type conductivity type material is formed over first region of semiconductor material 11, and includes a major surface 14.

Region of semiconductor material 13 includes an n-type epitaxial layer or region 16 formed over substrate 11. By way of example, layer 16 has a thickness of about 3 to 10 microns, and has a dopant concentration of about $5.0 \times 10^{15}$ atoms/cm$^3$. Preferably, layer 16 is doped with arsenic or antimony.

A p-type epitaxial layer 17 is formed over n-type layer 16, and has for example, a dopant concentration of about $5.0 \times 10^{15}$ atoms/cm$^3$ and a thickness of about 3.0 to 7.0 microns. Preferably, layer 17 is doped with boron. A second n-type epitaxial layer 18 is formed over p-type layer 17, and has for example, a dopant concentration of about $5.0 \times 10^{15}$ atoms/cm$^3$, and a thickness of about 3.0 to 7.0 microns.

Region of semiconductor material 13 further includes a second p-type layer 19 formed over n-type layer 18, and a third n-type epitaxial layer 21 formed over p-type layer 19. The characteristics of p-type layer 19 are, for example, similar to the characteristics of p-type layer 17, and the characteristics of n-type layer 21 are similar to the characteristics of n-type layer 18. A third p-type layer 23 is formed over n-type layer 21, and has for example, a dopant concentration of about $5.0 \times 10^{15}$ atoms/cm$^3$ and thickness of about 5 to 15 microns, which depends on the blocking or breakdown voltage requirements of device 10. P-type layer 23 preferably has a thickness that is greater than the thickness of adjacent layers 17, 18, 19, and 21. This allows device 10 to be more easily integrated with logic and control circuitry components on a power integrated circuit chip.

In one embodiment and as shown in FIG. 1, device 10 further includes a well, diffused, drift or extended drain region 26 of n-type conductivity formed in region of semiconductor material 13 and extending from major surface 14. By way of example, extended drain region 26 has a surface concentration on the order $7.0\times10^{15}$ atoms/cm$^3$, and a depth of about 4 to 10 microns. In an optional embodiment, a p-type layer or p-top region 27 is formed in well region 26 and extends from major surface 14 to provide a reduced surface field region. P-top region 27 allows for downward depletion when device 10 is in a blocking or off state, which allows device 10 to sustain a higher blocking voltage. Additionally, the thicknesses and dopant concentrations of layers 16, 17, 18, 19, 21, 23, 26, and 27 are selected to achieve charge balance between alternating layers in accordance to RESURF principles.

Isolation or field regions 31 are formed on device 10 to provide localized areas of passivation. Isolation regions 31 comprise for example, localized oxidation of silicon (LOCOS) regions, shallow trench isolation regions, field oxide regions, combinations thereof, or the like. In one embodiment, isolation regions 31 comprise thermal field oxide regions formed using the LOCOS technique, and have a thickness on the order of 0.5 to 2.0 microns.

A drain, trench drain region, trench drain structure, or filled trench drain 36 is formed in region of semiconductor material 13 extending from major surface 14 to a depth 37. In one embodiment, trench drain region 36 extends into n-type region 16. Bottom surface 38 of trench drain region 36 is rounded, curved, flat or combinations thereof.

To form trench drain region 36, a portion of region of semiconductor material 13 is exposed to a halogen based chemistry (e.g., bromine, chlorine, or fluorine) to etch a localized trench or trenches to a desired depth. The etched trench is then refilled with a conductive material such as a heavily doped polycrystalline semiconductor material. For example, trench drain region 36 comprises a polysilicon filled trench doped with an n-type dopant such as phosphorus. Alternatively, trench drain region 36 comprises a metal, a silicide, amorphous semiconductor material, or combinations thereof including combinations with a polycrystalline semiconductor material. The fill material is etched back or planarized as shown in FIG. 1, or a portion of the fill material may extend onto major surface 14.

Device 10 further includes a p-type high voltage region, body region or diffused region 41 and an n-type source region 43 extending from major surface 14. Body region 41 preferably only extends partially into region of semiconductor material 13.

Device 10 also includes a gate structure 46 including a first or gate trench structure or portion 47 formed in region of semiconductor material 13, a second or surface gate structure or portion 49 formed over a portion of major surface 14, and a gate electrode 51 coupled to gate portions 47 and 49. Gate trench portion 47 controls conduction in a plurality of or multiple sub-surface channels. In particular, gate trench portion 47 controls conduction in sub-surface channel regions 57, 571, 572, and 573. Surface gate portion 49 controls conduction in a second or surface channel region 58.

Gate trench portion 47 includes a first gate dielectric layer 53 formed on sidewall and lower surfaces and a trench fill portion 54. Trench fill portion 54 comprises, for example, a doped polycrystalline material such as polysilicon doped with an n-type dopant such as phosphorous. Trench fill portion 54 comprises the same material as trench drain region 36 or a different material. Gate dielectric layer 53 comprises, for example, a silicon oxide having a thickness of about 0.01 to 0.1 microns. Alternatively, gate dielectric layer 53 comprises other dielectrics such as silicon nitride, tantalum pentoxide, titanium dioxide, barium strontium titanate, or combinations thereof including combinations with silicon oxide.

The trench for gate trench portion 47 is formed using for example, a halogen based etch chemistry. Gate trench portion 47 has a depth 48 that is the same as depth 37. Alternatively and as shown in FIG. 1, depth 48 is greater than depth 37. For example, depth 48 extends into substrate 11 to provide a low potential termination, while depth 37 extends into n-type region 16 to avoid forming a pn junction where trench drain region 36 terminates. Bottom surface 50 of trench drain region 36 is rounded, curved, flat or combinations thereof. In one embodiment, depth 37 is on the order of 32 microns and depth 48 is on the order of 40 microns.

The gate trench is then refilled with a conductive material such as a heavily doped polycrystalline semiconductor material. For example, trench fill portion 54 comprises a polysilicon doped with an n-type dopant such as phosphorus. Alternatively, trench fill portion 54 comprises a metal, a silicide, amorphous semiconductor material, or combinations thereof including combinations with polycrystalline semiconductor material.

Surface gate portion 49 includes a second gate dielectric layer 63 and a gate conductive portion 64. Second gate dielectric layer 63 is the same as or different than gate dielectric layer 53. Gate conductive portion 64 comprises the same material or a different material than trench fill portion 53. Specifically, gate conductive portion 64 is an extension of trench fill portion 54, or it is a separately formed layer.

Gate electrode 51 comprises a conductive material such as aluminum or an aluminum alloy. An additional dielectric or passivation layer 71 is formed over major surface 14 and patterned to form contact openings. Passivation layer 71 comprises, for example, a deposited silicon oxide. A drain electrode 66 comprising a conductive material such as aluminum or an aluminum alloy is coupled to trench drain region 36, and a source electrode 67 comprising a conductive material such as aluminum or an aluminum alloy is coupled to source region 43. By way of example, trench drain region 36 and trench gate portion 47 have width of about 10 microns or less. An additional heavily doped shallow p-type region 52 is formed in body region 41 adjacent to source region 43 to increase the integrity of the source to body connection.

During operation a gate bias $V_g$ is applied to gate electrode 51 and a drain voltage $V_d$ is applied to drain electrode 66 while the source electrode is grounded. When the gate bias $V_g$ exceeds the threshold voltages of device 10 (i.e., gate voltages necessary to form channel regions 57, 571, 572, 573, and 58), current components $I_1$, $I_2$, $I_3$, and $I_4$ flow between source region 43 and trench drain region 36.

One advantage of the present invention is that n-type regions 16, 18, and 21 provide additional low resistance paths or drift regions for current to flow, which reduces on resistance $R_{ON}$, without increasing the area of device 10. This reduces $R_{ON}$*Area without detrimentally impacting the blocking voltage of device 10 or increasing die or chip size. When under a positive gate bias, gate trench portion 47 causes electrons to accumulate at the interface between layers 16, 18, and 21 and gate trench portion 47 thereby further reducing the resistance in the areas.

Also, n-type well or drift region 26 and channel 58 provide an additional current path (e.g., $I_1$) for device 10, which provides a lower $R_{ON}$ compared to prior art structures. Additionally, because n-type regions 16, 18, and 21 are sub-surface regions, the robustness of device 10 is improved because these current paths are away from major surface 14, which reduces charge injection into isolation regions 31 and gate dielectric layer 63.

One further advantage of device 10 is that p-type region 23 is thicker than regions 17, 18, 19, and 21, which allows device 10 to be more easily integrated with logic and control circuitry devices. This reduces manufacturing and design costs. In addition, device 10 does not require expensive SOI substrates, which saves cost. Further, p-type body region 41 is diffused to a shallow depth (e.g., 3–5 microns) and extends only partially into region of semiconductor material 13. As a result, the manufacturing costs and size of device 10 are reduced compared to prior art devices having very deep diffused body regions (e.g., 30–40 microns). Moreover, in a preferred embodiment, the alternating layers are formed using epitaxial growth techniques, which eliminates the need for multiple expensive photolithography, ion implantation and diffusion steps. Epitaxial growth also allows for the use of more alternating layers than can be achieved using photolithography, ion implantation and diffusion steps.

Figure 2:
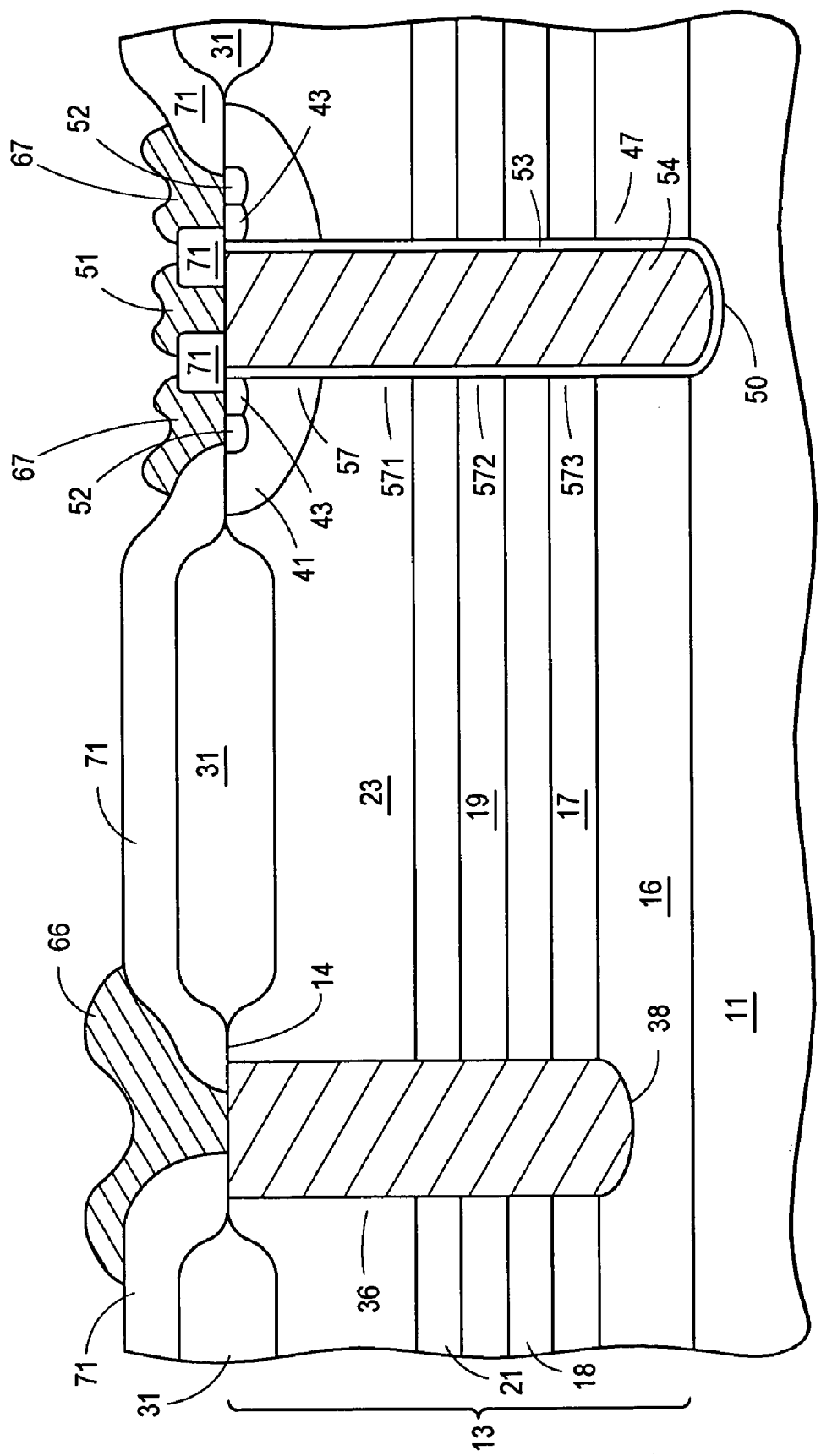
FIG. 2 illustrates an enlarged partial cross-sectional view of an alternative embodiment of a MOSFET cell.

FIG. 2 shows an enlarged cross-sectional view of alternative embodiment of a lateral MOSFET device or cell 100. Device 100 is similar to device 10 except that device 100 is formed without an n-type well region 26, a p-type region 27, or a surface gate portion 49. In this embodiment, only channel region 57 and trench gate portion 47 are present. In device 100, current flows through n-type regions 16, 18, and 21, which are all sub-surface regions. In certain applications, device 100 provides a more robust switch because of the sub-surface current paths.

Figure 3:
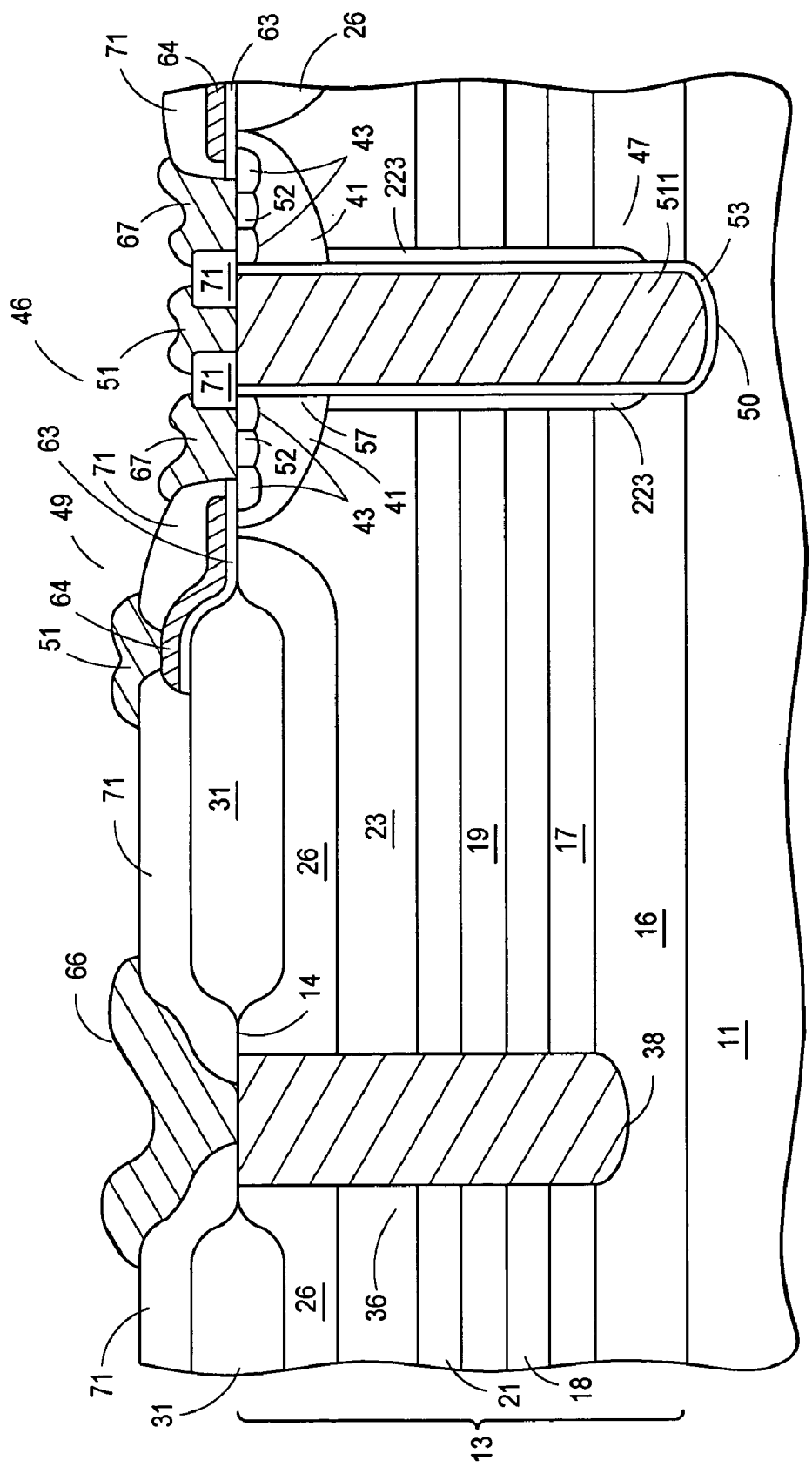
FIG. 3 illustrates an enlarged partial cross-sectional view of a further embodiment of a MOSFET cell.

FIG. 3 shows an enlarged cross-sectional view of a further embodiment of a lateral MOSFET device or cell 200. Device 200 is similar to device 10 except that n-type regions or layers 223 are formed along the sidewalls of trench gate portion 47. N-type regions 223 are formed using, for example, angled ion implantation techniques. A masking layer, for example, prevents n-type dopant from doping body region 41 along the sidewalls of trench gate portion 47. N-type regions 223 reduce resistance in regions 17, 19, and 21 when device 200 is conducting current, which further reduces $R_{ON}$ and $R_{ON}$*Area.

Simulation analysis of device 10 showed that it is capable of blocking voltages greater than 600 volts while achieving $R_{ON}$*Area results on the order of 70 to 90 mohm*cm$^2$, which is a significant improvement over prior art devices. For example, prior art single RESURF devices typically have $R_{ON}$*Area results on the order of 400 mohm*cm$^2$, and double RESURF devices typically having $R_{ON}$*Area results on the order of 200 mohm*cm$^2$.

Thus it is apparent that there has been provided, in accordance with the present invention, a lateral FET structure having improved blocking voltage and specific on-resistance performance. The structure provides multiple drift regions for current conduction while eliminating silicon on insulator substrates, multiple epitaxial layers with multiple ion implanted regions, and deep diffusion requirement thereby reducing manufacturing costs. The structure further provides design flexibility compared to the prior art, which improves design costs and reduces design cycle time.

Although the invention has been described and illustrated with reference to specific embodiments thereof, it is not intended that the invention be limited to these illustrative embodiments. For example, more or less alternating layers of p-type and n-type material may be used. Those skilled in the art will recognize that modifications and variations can be made without departing from the spirit of the invention. Therefore, it is intended that this invention encompass all such variations and modifications as fall within the scope of the appended claims.

We claim:

1. A lateral IGFET device comprising: semiconductor substrate having a first conductivity type; a region of semiconductor material comprising alternating layers of first and second conductivity type material deposited over the semiconductor substrate and having a first major surface, the region of semiconductor material further including a top layer of the first conductivity type formed adjacent the first major surface and one of the alternating layers of the second conductivity type formed adjacent and below the top layer; a drain region of the second conductivity type extending from the first major surface into at least a portion of the region of semiconductor material and adjoining at least a portion of the alternating layers; a body region of the first conductivity type formed in a portion of the region of semiconductor material and extending from the first major surface partially into the top layer; a first source region formed in the body region; a trench gate structure formed in a portion of the region of semiconductor material and adjoining the alternating layers, the body region and the first source region, wherein the trench gate structure controls a sub-surface channel region; and a surface gate structure including a gate dielectric layer formed overlying t-he first major surface and a gate electrode layer over-lying the gate dielectric layer, wherein the surface gate structure extends over the first source region and controls conduction in a surface channel region.

2. The device of claim 1 wherein in the drain region comprises a trench filled with a doped polycrystalline material.

3. The device of claim 1 wherein the trench gate structure is filled with a doped polycrystalline material of the second conductivity type, and wherein the trench gate structure extends from the first major surface adjacent the source region and a portion of the body region into the region of semiconductor material, and wherein the trench gate includes a first gate dielectric layer formed at least on sidewall surfaces of the trench gate structure.

4. The device of claim 3 further comprising a first doped region of the second conductivity type formed adjoining a portion of the sidewall surfaces and portions of the alternating layers and extending into the semiconductor region below the body region.

5. The device of claim 1 wherein a lower portion of the trench gate structure terminates within the semiconductor substrate.

6. The device of claim 1 wherein the top layer is thicker than adjacent layers in the region of semiconductor material.

7. The device of claim 1 further comprising a drain extension region of the second conductivity type formed in the top layer and between the body region and the drain region and further contacting the drain region.

8. A lateral MOSFET device comprising: a semiconductor substrate; a region of semiconductor material including a plurality of alternating layers of first and second conductivity semiconductor material formed overlying the semiconductor substrate and having a major surface; a trench drain structure formed in the region of semiconductor material; a body region of the first conductivity type formed in the region of semiconductor material; a source region of the second conductivity type formed in the body region; a trench gate structure formed in the region of semiconductor material adjoining at least a portion of the alternating layers, the body region and the source region, wherein the trench gate structure controls a sub-surface channel region; and a surface gate structure including a gate dielectric layer and a gate conductive portion formed overlying the major surface and adjacent the body region and the source region, wherein the surface gate structure controls a surface channel region.

9. The lateral MQSFET device of claim 8 further comprising an extended drain region of the second conductivity type formed in a portion of the region of semiconductor material and extending from the major surface, and a top region of the first conductivity type formed in the extended drain region.

10. The lateral MOSFET device of claim 8 further comprising a doped region of the second conductivity type formed in the region of semiconductor material adjacent a portion of the trench gate structure and below the body region.

11. The lateral MOSFET device of claim 8 wherein the region of semiconductor material includes a layer of the first conductivity type at the major surface, and wherein the layer has a thickness greater than adjacent layers within the region of semiconductor material.

12. The lateral MOSFET device of claim 8 wherein at least a portion of the alternating layers within the region of semiconductor material extend between the trench drain structure and the trench gate structure.

13. The lateral NOSFET device of claim 8 wherein the trench drain structure includes a trench filled with a polycrystalline semiconductor materiel having the second conductivity type.

14. The lateral MOSFET device of claim 8 wherein the trench gate structure extends further into the region of semiconductor material than the trench drain structure.

15. An insulated gate FET structure comprising:
 alternating layers of first and second conductivity type material forming a semiconductor region;
 a trench gate structure formed in the alternating layers, wherein the trench gate structure controls a subsurface channel region;
 a body region of the first conductivity type formed in the semiconductor region adjacent the trench gate structure;
 a drain region of the second conductivity formed in the semiconductor region and spaced apart from the trench gate structure and extending into the alternating layers;
 a source region of the second conductivity type formed in the body region and adjacent to the trench gate structure; and
 a doped region of the second conductivity type formed along a sidewall of the trench gate structure and extending into the semiconductor region below the body region.

16. The insulated gate FET structure of claim 15 wherein the drain region comprises a trench filled with a polycrystalline semiconductor material.

17. The insulated gate FET structure of claim 16 wherein the trench gate structure extends into the alternating layers deeper than the drain region.

18. The insulated gate FET structure of claim 15 wherein the trench gate structure controls a plurality of sub-surface channel regions.

19. The insulated gate FET structure of claim 15 further comprising:
 a top layer of the second conductivity formed over one of the alternating layers of the first conductivity type to form an upper major surface of the semiconductor region, wherein the top layer is thicker than the alternating layers of first and second conductivity type;
 an extended drain region of the second conductivity type formed in a portion of the top layer and extending partially into the top layer from the upper major surface; and
 a surface gate portion including a gate dielectric layer overlying the upper major surface of the semiconductor region and a gate conductive portion overlying the gate dielectric portion, wherein the surface gate portion controls a channel for conducting current at the upper major surface.

* * * * *